United States Patent
Matsumoto

(10) Patent No.: US 8,433,990 B2
(45) Date of Patent: Apr. 30, 2013

(54) SEMICONDUCTOR TEST APPARATUS AND TEST METHOD

(75) Inventor: Mitsuo Matsumoto, Tokyo (JP)

(73) Assignee: Advantest Corporation, Tokyo (JP)

(*) Notice: Subject to any disclaimer, the term of this patent is extended or adjusted under 35 U.S.C. 154(b) by 702 days.

(21) Appl. No.: 12/602,144

(22) PCT Filed: May 12, 2008

(86) PCT No.: PCT/JP2008/001183
§ 371 (c)(1),
(2), (4) Date: Dec. 24, 2009

(87) PCT Pub. No.: WO2008/146451
PCT Pub. Date: Dec. 4, 2008

(65) Prior Publication Data
US 2010/0161264 A1 Jun. 24, 2010

(30) Foreign Application Priority Data
May 28, 2007 (JP) .................... 2007-140762

(51) Int. Cl.
*G06F 11/00* (2006.01)
(52) U.S. Cl.
USPC .................... 714/817; 714/742
(58) Field of Classification Search .......... 714/817, 714/738, 742, 744, 789
See application file for complete search history.

(56) References Cited

U.S. PATENT DOCUMENTS

| 4,280,220 A | * | 7/1981 | Vaeches | 714/744 |
| 5,144,225 A | * | 9/1992 | Talbot et al. | 324/73.1 |
| 5,929,628 A | * | 7/1999 | Becker et al. | 324/750.02 |
| 6,691,262 B1 | * | 2/2004 | Itahara | 714/705 |
| 2010/0283485 A1 | * | 11/2010 | Valisuo et al. | 324/663 |

FOREIGN PATENT DOCUMENTS

| JP | 04-054473 | | 2/1992 |
| JP | 04-054473 | A | 2/1992 |
| JP | H05-045396 | A | 2/1993 |
| JP | H05-107321 | A | 4/1993 |
| JP | 06-308197 | | 11/1994 |
| JP | 2001-522462 | A | 11/2001 |
| JP | 2004-209153 | | 11/2004 |
| JP | 2004-309153 | A | 11/2004 |
| TW | 200702676 | | 1/2007 |

OTHER PUBLICATIONS

Office Action for the corresponding Taiwanese Patent App. No. 97119408, and its English translation.
Office Action issued for related Japanese Patent Application No. 2009-516168 dated Sep. 4, 2012 and its English translation.

* cited by examiner

*Primary Examiner* — Dieu-Minh Le
(74) *Attorney, Agent, or Firm* — Ladas & Parry, LLP

(57) ABSTRACT

In a semiconductor test apparatus, a voltage source generates a power supply voltage to be supplied to a DUT. A decision processor makes the DUT execute a predetermined test sequence. A noise generator superimposes a periodic pulse-like noise voltage on the power supply voltage to be supplied to the DUT, while the test sequence is being executed. The noise generator superimposes a noise voltage synchronized with a clock signal to be supplied to the DUT.

17 Claims, 6 Drawing Sheets

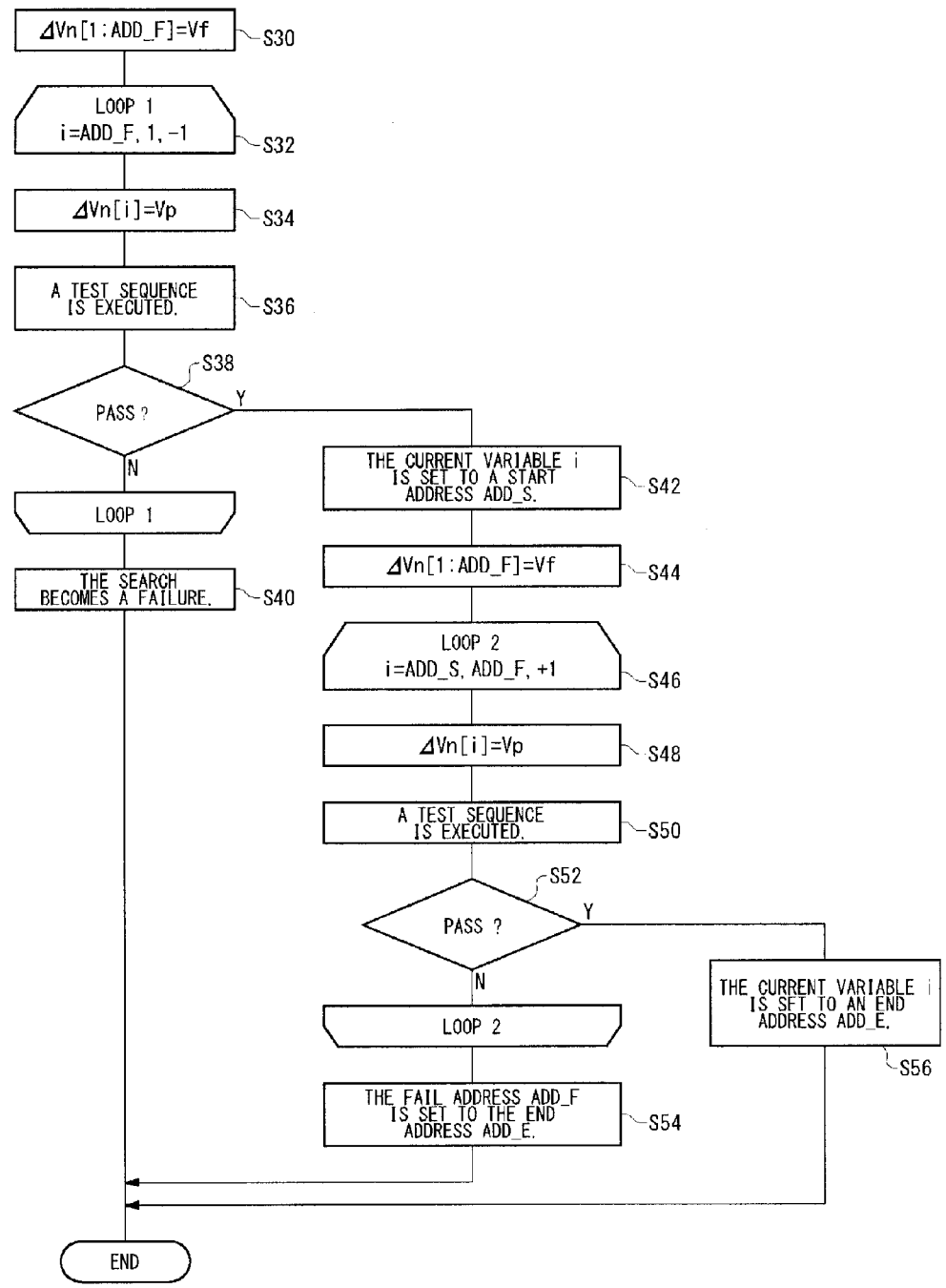

FIG.6A

| i | ΔVn[1] | [2] | [3] | [4] | [5] |
|---|---|---|---|---|---|
| INITIAL STAGE | Vf | Vf | Vf | Vf | Vf |
| i = 5 | Vf | Vf | Vf | Vf | Vp |
| i = 4 | Vf | Vf | Vf | Vp | Vp |
| i = 3 | Vf | Vf | Vp | Vp | Vp |
| i = 2 | Vf | Vp | Vp | Vp | Vp |

FIG.6B

| i | ΔVn[1] | [2] | [3] | [4] | [5] |
|---|---|---|---|---|---|
| INITIAL STAGE | Vf | Vf | Vf | Vf | Vf |
| i = 2 | Vf | Vp | Vf | Vf | Vf |
| i = 3 | Vf | Vp | Vp | Vf | Vf |
| i = 4 | Vf | Vp | Vp | Vp | Vf |

SEMICONDUCTOR TEST APPARATUS AND TEST METHOD

CROSS-REFERENCE TO RELATED APPLICATIONS

This application is the U.S. National Stage of International Patent Application No. PCT/JP2008/001183, filed on May 12, 2008, which claims priority to Japanese Application No. 2007-140762, filed on May 28, 2007, the disclosure of which is incorporated herein by reference.

BACKGROUND OF THE INVENTION

1. Field of the Invention

The present invention relates to a semiconductor test apparatus.

2. Description of the Related Art

A semiconductor test apparatus is used for determining whether a semiconductor integrated circuit operates in the same way as designed. The semiconductor test apparatus supplies a predetermined test pattern to a semiconductor integrated circuit (hereinafter, simply referred to as a DUT: Device Under Test) to be tested, so that the DUT executes processing based on the test pattern. As a result, if the processing by the DUT is normally completed, the DUT is determined as pass.

When the DUT is a memory or the like, resistance characteristics thereof against power supply voltages are often checked by changing a power supply voltage to be supplied to the DUT. In the test apparatus disclosed in Patent Document 1, the resistance characteristics of the DUT have been checked by changing a power supply voltage at every time when a series of test patterns are supplied to the DUT.

[Patent Document 1] Japanese Patent Application Publication No. Hei 6-308197

However, in the test apparatus disclosed in Patent Document 1, a power supply voltage is fixedly varied while the test pattern is being executed, and hence the resistance characteristics thereof against a variation in pulse-like power supply voltages cannot be checked. In recent semiconductor devices that can operate with increasingly reduced voltages, the resistance characteristics against a pulse-like noise (impulse noise) is an important issue to both of designers and users of semiconductor devices.

SUMMARY OF THE INVENTION

The present invention has been made in view of the aforementioned problem, and a purpose thereof is to provide a semiconductor test apparatus in which a test for a variation in power supply voltages can be performed.

An embodiment of the present invention relates to a semiconductor test apparatus. The semiconductor test apparatus according to the embodiment comprises: a voltage source that generates a power supply voltage to be supplied to a DUT; a decision processor that makes the DUT execute a predetermined test sequence; and a noise generator that superimposes an impulse-like noise voltage on the power supply voltage to be supplied to the DUT, while the test sequence is being executed.

According to the embodiment, the resistance characteristics against a variation in the impulse-like power supply voltages can be checked.

Another embodiment of the present invention also relates to a semiconductor test apparatus. The semiconductor test apparatus comprises: a voltage source that generates a power supply voltage to be supplied to a DUT; a decision processor that makes the DUT execute a predetermined a test sequence; and a noise generator that superimposes a periodic pulse-like noise voltage on the power supply voltage to be supplied to the DUT, while the test sequence is being executed.

According to the embodiment, the resistance characteristics against a variation in the periodic pulse-like power supply voltages can be checked. It is noted that the "pulse-like" means a concept including an impulse-like pulse as well as a rectangular wave-like pulse.

The noise generator may superimpose a noise voltage synchronized with a clock signal to be supplied to the DUT. It is noted that being "synchronized with a clock signal" means the case where the frequency of the noise voltage is equal to that of the clock signal as well as the case where the frequency of the noise voltage is equal to a frequency obtained by multiplying or dividing the frequency of the clock signal by an integer. An arbitrary phase difference may be present between the noise voltage and the clock signal. The DUT latches data or executes operation processing by using the clock signal. Accordingly, by superimposing the noise voltage synchronized with the clock signal, the DUT can be checked under strict conditions.

The semiconductor test apparatus according to an embodiment may further comprise an oscillator that generates a clock signal to be supplied to the DUT. The noise generator may generate a noise voltage in synchronization with the clock signal from the oscillator.

The decision processor may generate a test pattern that can be distinguished by an address at every predetermined unit time such that the test pattern is supplied to the DUT. The noise generator may be configured such that the noise generator can adjust the amplitude of the noise voltage independently at every unit time of the test pattern. According to the embodiment, the amplitude of the noise voltage can be changed for every address period, and hence the address in the test pattern in which an error is likely to occur can be specified. Further, from the address in the test pattern thus specified, a circuit block having low resistance characteristics against a variation in power supply voltages can be estimated.

The semiconductor test apparatus according to an embodiment may further comprise: a fail address acquisition unit that acquires, when the DUT is determined as fail, an address of a test pattern in which the fail has occurred; and a noise control unit that reconfigures the amplitude of the noise voltage at every unit time based on the fail address designating the address in which the fail has occurred. The decision processor may redetermine pass/fail of the DUT in a state where the amplitude of the noise voltage thus reconfigured is superimposed. As a result of reconfiguring the amplitude of the noise voltage to redetermine the DUT, when the DUT is determined as pass, it can be estimated that the address corresponding to the address period in which the amplitude of the noise voltage has been changed, is weak against a noise.

The noise control unit may set at least one address before the fail address as a test address such that the amplitude of the noise voltage is set to be small in an address period corresponding to the test address. When the DUT is determined as fail, it is highly possible that an error has occurred due to a noise applied before the fail address. Accordingly, when redetermining pass/fail of the DUT in a state where the amplitude of the noise voltage in an address period before the fail address is made small, and when the DUT is determined as pass, a circuit block having low noise-resistance characteristics can be estimated based on the pattern address in the address period.

The noise control unit may scan the test address until the DUT is determined as pass, as a result of redetermination by the decision processor. In other words, the noise control unit may search for the test address in which the DUT is determined as pass.

Another embodiment of the present invention relates to a semiconductor test method. The semiconductor test method comprises: making a DUT execute a predetermined test sequence to determine pass/fail of the DUT; and superimposing an impulse-like noise voltage on a power supply voltage to be supplied to the DUT, while the test sequence is being executed.

A semiconductor test method according to another embodiment of the present invention comprises: making a DUT execute a predetermined test sequence to determine pass/fail of the DUT; and superimposing a periodic pulse-like noise voltage on a power supply voltage to be supplied to the DUT, while the test sequence is being executed.

The semiconductor test method according to an embodiment may further comprise: acquiring, when the DUT is determined as fail, an address of a test pattern in which the fail has occurred; setting at least one address before the fail address designating the address in which the fail has occurred, as a test address such that the amplitude of the noise voltage is set to be small in a period corresponding to the test address; and making the DUT reexecute the test sequence with a noise voltage thus set.

The semiconductor test method of an embodiment may repeat changing the test address until the DUT is determined as pass. Thereby, an address weak against a noise can be searched for.

Another embodiment of the present invention also relates to a semiconductor test method. The method executes the following processing:

(1) generating a test pattern that can be distinguished by an address at every predetermined unit time;

(2) determining pass/fail of a DUT by using the test pattern in a state where a noise voltage synchronized with the unit time is superimposed on a power supply voltage to be supplied to the DUT;

(3) acquiring, when the DUT is determined as pass, the amplitude of the noise voltage as a pass voltage;

(4) acquiring, when the DUT is determined as fail, the amplitude of the noise voltage as a fail voltage;

(5) setting the amplitude of the noise voltage as the fail voltage with respect to at least one unit time of the test pattern, and setting that as the pass voltage with respect to a remaining unit time;

(6) redetermining pass/fail of the DUT in a state where the noise voltage set in the step (5) is superimposed; and executing repeatedly the steps (5) and (6) until the DUT is determined as pass. According to the aforementioned processing, the unit time when the amplitude of the noise voltage is set to the pass voltage, indicates the address weak against a noise, at the time when the DUT is determined as pass. Accordingly, a circuit block or a circuit path that is weak against a noise, can be specified or estimated based on the address weak against a noise.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5 is a flow chart illustrating a search algorithm by which a pattern address weak against a noise is searched for; and FIGS. 6A and 6B are tables illustrating transitions of an amplitude $\Delta Vn$ in the search algorithm in FIG. 5.

DETAILED DESCRIPTION OF THE INVENTION

Figure 1:
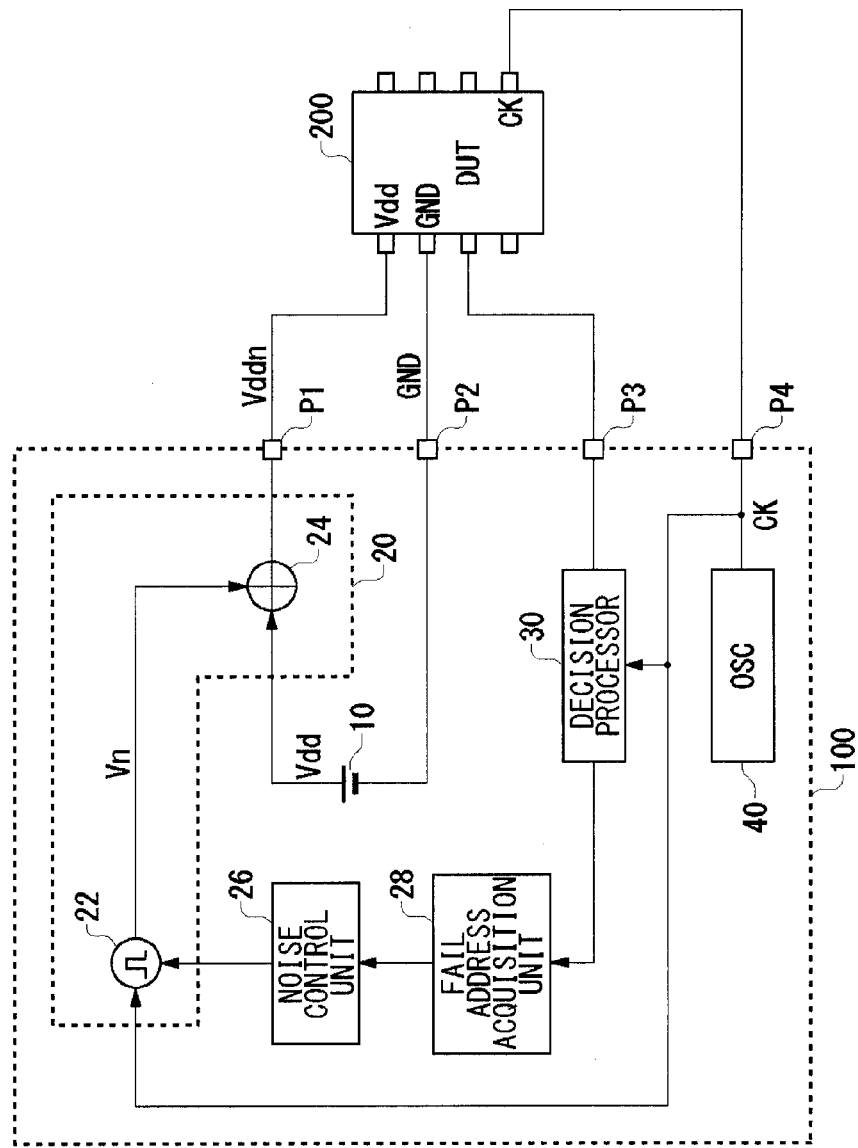
FIG. 1 is a block diagram illustrating the structure of a semiconductor test apparatus according to an embodiment.

The present invention will be described below with reference to the drawings based on the preferred embodiments. The same or equivalent constituting elements, members and processing illustrated in each drawing shall be denoted by the same reference numerals, and the duplicative explanations will be omitted appropriately. The embodiments do not intend to limit the scope of the present invention, but exemplify the invention. All of the features and the combinations thereof described in the embodiments are not necessarily essential to the invention. Herein, "the state where a member A is connected to a member B" includes not only the state where the member A is physically and directly connected to the member B but also the state where the member A is indirectly connected to the member B via another member that does not affect electrically the connection state between them.

FIG. 1 is a block diagram illustrating the structure of a semiconductor test apparatus 100 according to an embodiment. The semiconductor test apparatus 100 supplies a power supply voltage Vdd to a DUT 200, and makes the DUT 200 execute a predetermined test sequence to determine pass/fail of the DUT. The DUT 200 may be any one of a digital circuit, an analog circuit or a memory circuit; however, the following description will be made, assuming that the DUT 200 includes a circuit block that performs signal processing based on a clock signal CK. The DUT 200 is mounted in a device mounting portion (not illustrated) to receive the power supply voltage Vdd, a ground voltage GND and the clock signal CN from the semiconductor test apparatus 100.

The semiconductor test apparatus 100 comprises a voltage source 10, a noise generator 20, a noise control unit 26, a fail address acquisition unit 28, a decision processor 30 and an oscillator 40. The voltage source 10 generates a power supply voltage Vdd to be supplied to the DUT 200. The decision processor 30 makes the DUT 200 execute a predetermined test sequence to determine pass/fail of the DUT 200. In the present embodiment, the decision processor 30 outputs a test pattern via a test terminal P3. The test pattern is virtually divided on the time axis such that the test pattern can be distinguished by an address at every predetermined unit time. Hereinafter, an address in the test pattern is referred to as a pattern address ADD, and a unit time corresponding to the address as an address period T. The DUT 200 receives the test pattern and performs predetermined signal processing in response to the test pattern. The decision processor 30 determines the DUT as pass, when the data obtained from the result of the signal processing is the same as the data expected from the test pattern; and in contrast, determines the DUT as fail, when the data from the result of the signal processing is not the same as the data expected. The decision processor 30 outputs pass/fail for each pattern address unit. If the fail occurs in any one of pattern addresses, the DUT is determined as fail, discontinuing the test at the time. If the pass is outputted for all the pattern addresses, the DUT is determined as pass.

The oscillator 40 generates the clock signal CK. The clock signal CK is supplied to the DUT 200 via a clock terminal P4. The DUT 200 performs the signal processing synchronized with the clock signal CK. The decision processor 30 generates the test pattern synchronized with the clock signal CK. In FIG. 1, the clock signal CK is supplied to the DUT 200 through the line only for the clock; however, may be supplied thereto with other data by using a CDR (Clock Data Recovery), etc.

The noise generator 20 superimposes a periodic pulse-like noise voltage Vn on the power supply voltage Vdd to be supplied to the DUT 200, while the test sequence is being executed by the DUT 200. The noise generator 20 includes a pulse generator 22 that generates the noise voltage Vn and a pulse superimposing unit 24 that superimposes the noise voltage Vn on the power supply voltage Vdd. For example, the pulse superimposing unit 24 may be configured to include a coupling capacitor, one end of which is connected to the positive electrode of the voltage source 10 and the other end of which to the pulse generator 22. Any structure of the pulse superimposing unit 24 is acceptable.

In the present embodiment, the noise generator 20 superimposes the noise voltage Vn synchronized with the clock signal CK to be supplied to the DUT 200, on the power supply voltage Vdd. The pulse generator 22 receives the clock signal CK generated by the oscillator 40, and generates the noise voltage Vn by using the clock signal CK. The pulse generator 22 can be configured by using a PLL circuit or a frequency divider, which multiples or divides the clock signal CK by an integer, or using a counter that counts the clock signal CK. The structure of the pulse generator 22 is not particularly limited. It is desirable that the phase difference between the noise voltage Vn, generated by the pulse generator 22, and the clock signal CK can be arbitrarily adjusted. It is preferable that the pulse width of the noise voltage Vn can also be arbitrarily adjusted. The noise voltage Vn is preferably a steep impulse-like voltage such as a surge noise. Because the noise voltage Vn is considered to be a noise occurring in the natural world, the pulse width thereof can be shorter or longer than one clock cycle of the system. When the pulse width is longer to some extent, the noise voltage Vn can be recognized as a rectangular wave noise voltage; and in contrast, when the pulse width is very shorter, the voltage Vn can be recognized as an impulse noise.

Figure 2:
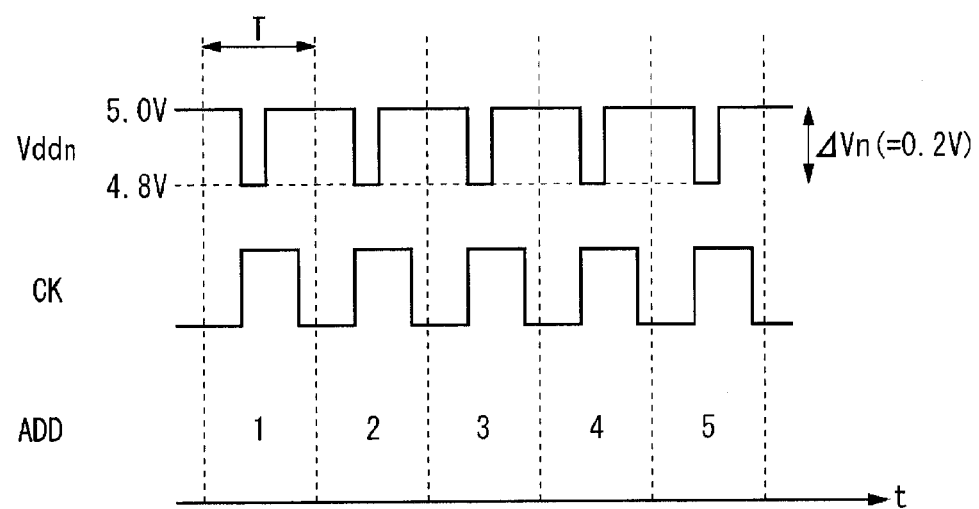
FIG. 2 is a time chart illustrating a power supply voltage Vddn on which a noise voltage Vn is superimposed, a clock signal CK and a pattern address of a test pattern.

In the present embodiment, the noise generator 20 can adjust the amplitude ΔVn of the noise voltage Vn independently for every address period T corresponding to the pattern address. FIG. 2 is a time chart illustrating the power supply voltage Vddn on which the noise voltage Vn is superimposed, the clock signal CK and the pattern address ADD. In the example of FIG. 2, ΔVn is set to 0.2 V in the address periods T corresponding to all the pattern addresses ADDs. In the same example, the address period T is equal to the cycle time of the clock signal CK.

For example, in a certain test, when the amplitudes ΔVn of all the address periods are set to the same value, which is swept to determine pass/fail of the DUT 200 for each amplitude ΔVn, noise-resistance characteristics of the DUT 200 can be measured. When the noise-resistance characteristics thereof for a specific address period is requested to be checked, the amplitude ΔVn of the address period corresponding to the address has only to be larger than that of another address period.

According to the semiconductor test apparatus 100 of the present embodiment, the power supply voltage Vddn on which the pulse-like noise voltage is superimposed can be supplied to the DUT 200, while the DUT 200 is executing a test sequence. Thereby, the resistance characteristics against a variation in the pulse-like power supply voltages can be checked. In particular, with the amplitude ΔVn being configured to be adjustable, it can be measured how much noise-resistance characteristics the DUT 200 has.

Further, in the present embodiment, the DUT can be checked under strict conditions by synchronizing the noise voltage Vn with the clock signal CK. Further, the noise voltage Vn is generated in synchronization with a test pattern, and the amplitude ΔVn of the noise voltage Vn is designed to be adjustable independently for every address period corresponding to the pattern address ADD. Thereby, a pattern address weak against a noise can be specified.

Subsequently, a technique in which a pattern address weak against a noise is searched for will be described. The noise control unit 26 at first sets the same amplitude ΔVn for all the address periods, and gradually changes the amplitude ΔVn. As the amplitude ΔVn is larger, the DUT 200 is more affected by a noise, causing a possibility that the DUT 200 may operate erroneously to be high. The semiconductor test apparatus 100 executes a predetermined test sequence for every amplitude ΔVn thus set, and determines pass/fail of the DUT 200.

When the amplitude ΔVn reaches a certain level, the fail occurs in any one of the pattern addresses, the DUT 200 being determining as fail by the decision processor 30. The noise control unit 26 acquires the level of the amplitude ΔVn (hereinafter, referred to as a fail voltage Vf) at this time. In addition to this, the noise control unit 26 also acquires the level of the amplitude ΔVn when the DUT 200 has passed immediately before the fail (hereinafter, referred to as a pass voltage Vp). For example, when Vdd=5 V, and if the DUT 200 passes when ΔVn=0.1 V and fails when ΔVn=0.2 V, then Vf=0.2 V and Vp=0.1 V hold.

When the DUT 200 is determined as fail by the decision processor 30, the fail address acquisition unit 28 acquires the pattern address when the fail has occurred (hereinafter, referred to as a fail address ADD_F). The noise control unit 26 sets the amplitude ΔVn for each address period based on the fail address ADD_F. The decision processor 30 generates a test pattern for the DUT 200, in a state where the reconfigured amplitude ΔVn of the noise voltage Vn is superimposed, so that pass/fail of the DUT 200 is redetermined.

The noise control unit 26 sets at least one of the pattern addresses ADDs before the fail address ADD_F, to a test address ADD_T. The noise control unit 26 sets the amplitude ΔVn of the noise voltage Vn to be small in an address period corresponding to the test address ADD_T. The noise control unit 26 scans the test address ADD_T until the DUT 200 is determined as pass by the decision processor 30, so that the address causing the fail is specified.

Figure 3:
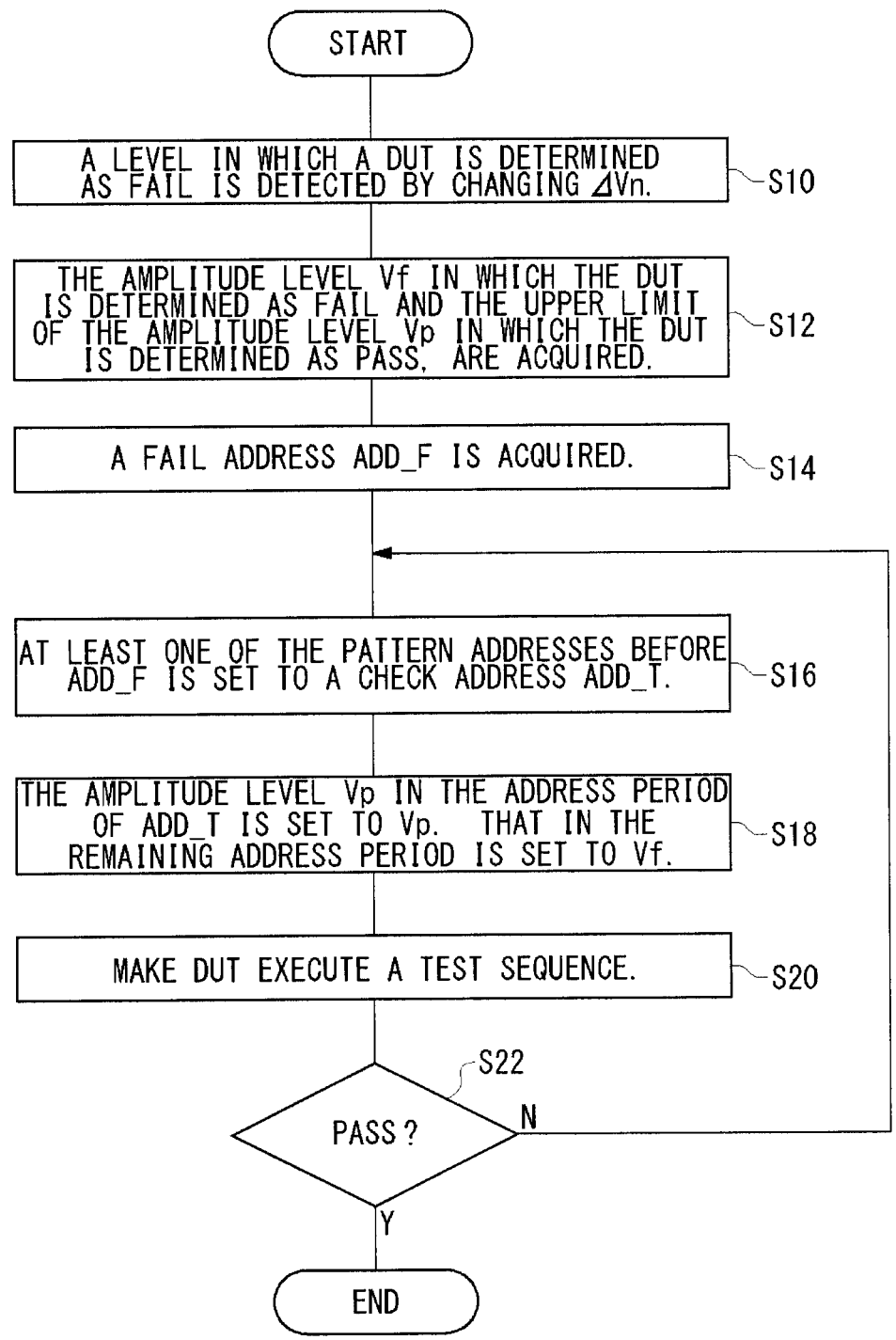
FIG. 3 is a flow chart of a test using the semiconductor test apparatus in FIG. 1.
Figure 4A:
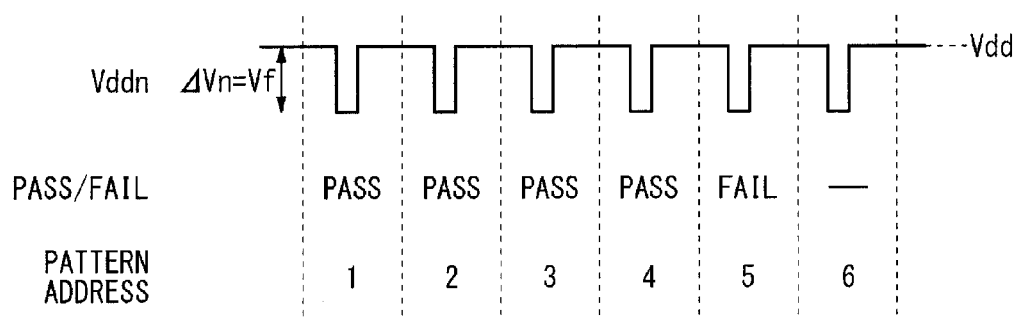
FIGS. 4A and 4B are time charts corresponding to that in FIG. 3.
Figure 4B:
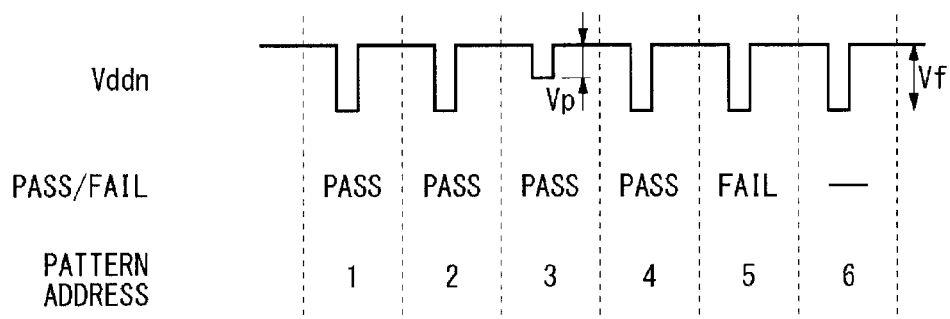

FIG. 3 is a flow chart in which the pattern address weak against a noise is searched for by the semiconductor test apparatus 100 in FIG. 1. FIGS. 4A and 4B are time charts corresponding to that in FIG. 3.

The semiconductor test apparatus 100 is initialized to start the check. As illustrated in FIG. 4A, all the address periods are at first initialized to the same amplitude ΔVn, and then the amplitude ΔVn is gradually changed (S10 in FIG. 3). When the amplitude ΔVn reaches a certain level, the DUT 200 is determined as fail by the decision processor 30. The noise control unit 26 acquires the level of the amplitude ΔVn at this time (hereinafter, referred to as a fail voltage Vf) (S12). In addition to this, the noise control unit 26 acquires the level of the amplitude ΔVn when the DUT 200 has passed immediately before the fail (hereinafter, referred to as a pass voltage Vp) (S12).

When the DUT 200 is determined as fail, the fail address acquisition unit 28 acquires the pattern address (fail address ADD_F) in which the fail has occurred (S14). FIG. 4A indicates a state where the fail has occurred in the pattern address ADD=5, when the amplitude ΔVn is set to a certain fail voltage Vf. In this case, the fail address ADD_F is set to 5.

Subsequently, the noise control unit 26 sets at least one of the pattern addresses ADDs before the fail address ADD_F, to the test address ADD_T (S16). The test address ADD_T may be a single pattern address ADD or include consecutive multiple pattern addresses ADDs. Alternatively, the test address ADD_T may include multiple pattern addresses ADDs that are not consecutive.

The noise control unit 26 sets the amplitude ΔVn in the address period corresponding to the test address ADD_T, to the pass voltage Vp. The noise control unit 26 sets the amplitude ΔVn in the address period corresponding to the pattern address other than the test address ADD_T, to the fail voltage Vf (S18). With this processing, the amplitude ΔVn of the noise voltage Vn in the address period corresponding to the test address ADD_T, is set to be small. As an example, FIG. 4B illustrates the power supply voltage Vddn when ADD_T=3. The amplitude ΔVn in the address period corresponding to the pattern address ADD=3 is set to the pass voltage Vp, and the remainder is set to the fail voltage Vf.

The decision processor 30 outputs a test pattern to the DUT 200 to make the DUT 200 execute the test sequence again (S20). In this case, the power supply voltage Vdd to be supplied to the DUT 200 is superimposed with a noise set in the step S18. After redetermining pass/fail of the DUT 200 (S22), when the DUT 200 is determined as pass (S22/Y), the test is completed after storing the test address ADD_T at the time. The designer of the DUT 200 can specify a circuit block having low noise-resistance characteristics in the DUT 200, from the test address ADD_T finally stored.

For example, when the DUT 200 is provided with a scanning flip-flop, a logic gate that executes processing corresponding to the test address ADD_T, can be specified. Or, even when the DUT 200 is not provided with a scanning flip-flop, a logic gate that becomes active in a certain pattern address can be specified by a simulation.

As a result of the determination of pass/fail S22, when the DUT 200 is determined as fail (S22/Y), another pattern address is reconfigured as the test address ADD_T, returning back to the step S16. The steps S18 to S22 are executed in the state, thereby redetermining pass/fail of the DUT 200 (S22).

According to the flow chart in FIG. 3, an address pattern weak against a noise can be specified by changing the test address ADD_T until the fail does not occur in the fail address ADD_F acquired in the step S14.

Subsequently, a specific example of the search algorithm (steps S16 to S22) in which a pattern address weak for a noise is searched for, will be described. The algorithm is executed by the noise control unit 26, the fail address acquisition unit 28 and the decision processor 30. FIG. 5 is a flow chart illustrating the search algorithm by which the pattern address weak against a noise is searched for. The flow chart in FIG. 5 illustrates the processing after the step S16 in FIG. 3. FIGS. 6A and 6B are tables illustrating transitions of the amplitude ΔVn in the search algorithm in FIG. 5.

In the following descriptions, the amplitude of the noise voltage Vn in the i-th address period is written as ΔVn[i]. At first, the amplitudes ΔVns[1:ADD_F] in the address periods of the pattern addresses 1 to ADD_F are set to the fail voltage Vf (S30).

Thereafter, the loop 1 (S32 to S38) is executed. In the loop 1, the variable i is decremented, assuming that the initial value is ADD_F, the target value is 1, and the difference is 1. In the loop, ΔVn[i] in the address period of the i-th pattern address is set to the pass voltage Vp (S34). And then, the DUT 200 is made to execute the test sequence (S36). As a result, when the DUT 200 is determined as pass (S38/Y), the processing passes through the loop 1 to proceed to the step 42, which will be described below. When the DUT 200 is determined as fail (S38/N), the processing returns back to the step S32 such that the variable i is decremented. If the processing does not pass through the loop 1 even when the variable i reaches the target value 1, the search becomes a failure (S40), ending the processing.

The amplitude ΔVn makes transitions as in FIG. 6A, by repeating the loop 1. FIG. 6A illustrates the case where ADD_F=5. It is assumed that, as a result of repeating the loop 1, the fail address ADD_F is changed to the pass (PASS) when i=2, and that the DUT 200 is determined as pass.

When the DUT 200 is determined as pass (S38/Y), the current variable i is set to a start address ADD_S (S42). Subsequently, the amplitudes ΔVns[1:ADD_F] in the address periods of the pattern addresses 1 to ADD_F are set to the fail voltage Vf (S44). Thereafter, the loop 2 is executed. In the loop 2, the variable i is decremented, assuming that the initial value is ADD_S, the target value is ADD_F and the difference is 1. In the loop, ΔVn[i] in the address period of the i-th pattern address, is set to the pass voltage Vp (S48). Thereafter, the DUT is made to execute the test sequence (S50). As a result, when the DUT 200 is determined as pass (S52/Y), the processing passes through the loop 2 to proceed to the step S56. When the DUT 200 is determined as fail (S52/N), the processing returns back to the step S46 such that the variable is incremented.

The amplitude ΔVn makes transitions as in FIG. 6B, by repeating the loop 2. FIG. 6B illustrates the case where ADD_F=5 and ADD_S=2. As a result of repeating the loop 2, it is assumed that the DUT 200 is determined as pass when i=4 (S52/Y). Subsequently, the current variable i is set to an end address ADD_E (S56). When the processing does not pass through the loop 2 even when the variable i reaches the target value ADD_E, the fail address ADD_F is set to the end address ADD_E, completing the search processing.

As a result of the aforementioned search algorithm, the start address ADD_S and the end address ADD_E can be specified. The start address ADD_S indicates the starting point of the pattern address weak against a noise, while the end address ADD_E the ending point thereof. The designer of the DUT 200 can estimate a circuit block having low noise-resistance characteristics in the DUT 200 from the start address ADD_S and the end address ADD_E. According to the aforementioned algorithm, a plurality of circuit blocks weak against a noise, if any, can be surely specified.

Following variations can be made to the aforementioned search algorithm:

(1) as the simplest variation, a state where the DUT 200 is determined as pass may be searched for by shifting one or consecutive multiple test addresses ADD_T forwards one by one, with the fail address ADD_F being the starting point; and (2) a binary search may be performed in which the pattern addresses 1 to ADD_F are at first divided into two, and either one of the two is set to the test address ADD_T to determine pass/fail thereof. The test address ADD_T that are determined as pass as a result of the first determination, is further divided into two to determine pass/fail thereof. By repeatedly executing this processing, the range of a pattern address weak against a noise can be specified. The algorithm in FIG. 6, those described in the aforementioned (1) and (2) and another algorithm may be used independently or in combination.

The aforementioned embodiments are intended to be illustrative only. It will be appreciated by those skilled in the art that various modifications to the constituting elements and processes could be developed and that such modifications are within the scope of the present invention. Hereinafter, such modifications will be described.

In the embodiment, the noise generator 20 is superimposed with the noise voltage Vn on the positive electrode side of the voltage generated by the voltage source 10, but is not limited thereto. For example, the pulse superimposing unit 24 may be arranged on the negative electrode side. In this case, the test for a ground noise can be performed, which have not been performed in the conventional semiconductor test apparatuses. Also, in the embodiment, the noise voltage Vn that spikes the power supply voltage Vdd to the negative side has been described, as illustrated in FIG. 2; however, the noise that spikes the power supply voltage Vdd to the positive side, namely, the voltage Vdd is increased, may be superimposed.

In the embodiment, the case where the frequency of the noise voltage Vn generated by the pulse generator 22 is equal to that of the clock signal CK to be supplied to the DUT 200, has been described. When the internal clock of the DUT 200 is set to a value obtained by multiplying the clock signal CK by an integer n, the pulse generator 22 may generate the noise voltage Vn obtained by multiplying the clock signal CK by n.

The present invention has been described based on the embodiments, which is only intended to illustrate the principle and applications of the invention, and a variety of modifications and variations in arrangement may be made to the embodiments within the range not departing from the spirit of the invention specified in appended claims.

The invention claimed is:

1. A semiconductor test apparatus comprising:
a voltage source that generates a power supply voltage to be supplied to a device under test;
a decision processor that makes the device under test execute a predetermined test sequence; and
a noise generator that superimposes an impulse-like noise voltage on the power supply voltage to be supplied to the device under test, while the test sequence is being executed;
wherein the decision processor generates a test pattern that can be distinguished by an address at every predetermined unit time such that the test pattern is supplied to the device under test, and wherein the noise generator is configured to be able to adjust the amplitude of the noise voltage independently at every unit time of the test pattern.

2. The semiconductor test apparatus according to claim 1, wherein the noise generator superimposes a noise voltage synchronized with a clock signal to be supplied to the device under test.

3. The semiconductor test apparatus according to claim 2 further comprising an oscillator that generates a clock signal to be supplied to the device under test, wherein the noise generator generates a noise voltage in synchronization with the clock signal from the oscillator.

4. The semiconductor test apparatus according to claim 1, further comprising:

a fail address acquisition unit that acquires, when the device under test is determined as fail, an address of a test pattern in which the fail has occurred; and
a noise control unit that reconfigures the amplitude of the noise voltage at every unit time based on a fail address designating the address in which the fail has occurred, wherein the decision processor redetermines pass or fail of the device under test in a state where the amplitude of the noise voltage thus reconfigured is superimposed.

5. The semiconductor test apparatus according to claim 4, wherein the noise control unit sets at least one address before the fail address as a test address such that the amplitude of the noise voltage is set to be small in an address period corresponding to the test address.

6. The semiconductor test apparatus according to claim 5, wherein the noise control unit scans the test address until the device under test is determined as pass, as a result of redetermination by the decision processor.

7. A semiconductor test apparatus comprising:
a voltage source that generates a power supply voltage to be supplied to a device under test;
a decision processor that makes the device under test execute a predetermined a test sequence; and
a noise generator that superimposes a periodic pulse-like noise voltage on the power supply voltage to be supplied to the device under test, while the test sequence is being executed;
wherein the decision processor generates a test pattern that can be distinguished by an address at every predetermined unit time such that the test pattern is supplied to the device under test, and wherein the noise generator is configured to be able to adjust the amplitude of the noise voltage independently at every unit time of the test pattern.

8. The semiconductor test apparatus according to claim 7, wherein the noise generator superimposes a noise voltage synchronized with a clock signal to be supplied to the device under test.

9. The semiconductor test apparatus according to claim 8 further comprising an oscillator that generates a clock signal to be supplied to the device under test, wherein the noise generator generates a noise voltage in synchronization with the clock signal from the oscillator.

10. The semiconductor test apparatus according to claim 7 further comprising:
a fail address acquisition unit that acquires, when the device under test is determined as fail, an address of a test pattern in which the fail has occurred; and
a noise control unit that reconfigures the amplitude of the noise voltage at every unit time based on a fail address designating the address in which the fail has occurred, wherein the decision processor redetermines pass or fail of the device under test in a state where the amplitude of the noise voltage thus reconfigured is superimposed.

11. The semiconductor test apparatus according to claim 10, wherein the noise control unit sets at least one address before the fail address as a test address such that the amplitude of the noise voltage is set to be small in an address period corresponding to the test address.

12. The semiconductor test apparatus according to claim 11, wherein the noise control unit scans the test address until the device under test is determined as pass, as a result of redetermination by the decision processor.

13. A semiconductor test method comprising:
making a device under test execute a predetermined test sequence to determine pass or fail of the device under test;

superimposing an impulse-like noise voltage on a power supply voltage to be supplied to the device under test, while the test sequence is being executed;

acquiring, when the device under test is determined as fail, an address of a test pattern in which the fail has occurred;

setting at least one address before a fail address designating the address in which the fail has occurred, as a test address such that the amplitude of the noise voltage is set to be small in an address period corresponding to the test address; and making the device under test reexecute the test sequence with a noise voltage thus set.

14. The semiconductor test method according to claim 13, wherein the setting at least one address as a test address is repeated until the device under test is determined as pass.

15. A semiconductor test method comprising:

generating a test pattern that can be distinguished by an address at every predetermined unit time;

determining pass or fail of a device under test by using the test pattern in a state where a noise voltage synchronized with the unit time is superimposed on a power supply voltage to be supplied to the device under test;

acquiring, when the device under test is determined as pass, the amplitude of the noise voltage as a pass voltage;

acquiring, when the device under test is determined as fail, the amplitude of the noise voltage as a fail voltage;

setting the amplitude of the noise voltage as the fail voltage with respect to at least one unit time of the test pattern, and setting that as the pass voltage with respect to a remaining unit time; and redetermining pass or fail of the device under test in a state where the noise voltage set in the setting is superimposed, wherein the setting the amplitude of the noise voltage and the redetermining pass or fail of the device under test are repeatedly executed.

16. A semiconductor test method comprising:

making a device under test execute a s redetermined test sequence to determine pass or fail of the device under test;

superimposing a periodic pulse-like noise voltage on a power supply voltage to be supplied to the device under test, while the test sequence is being executed;

acquiring, when the device under test is determined as fail, an address of a test pattern in which the fail has occurred;

setting at least one address before a fail address designating the address in which the fail has occurred, as a test address such that the amplitude of the noise voltage is set to be small in an address period corresponding to the test address; and making the device under test reexecute the test sequence with a noise voltage thus set.

17. The semiconductor test method according to claim 16, wherein the setting at least one address as a test address is repeated until the device under test is determined as pass.

* * * * *

UNITED STATES PATENT AND TRADEMARK OFFICE
CERTIFICATE OF CORRECTION

PATENT NO.       : 8,433,990 B2                                                                 Page 1 of 1
APPLICATION NO. : 12/602144
DATED            : April 30, 2013
INVENTOR(S)      : Mitsuo Matsumoto It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 727 days.

Signed and Sealed this
Eighth Day of September, 2015

Michelle K. Lee
*Director of the United States Patent and Trademark Office*